United States Patent
Fukai et al.

(10) Patent No.: US 10,401,438 B2
(45) Date of Patent: Sep. 3, 2019

(54) MAGNETIC SENSOR AND MAGNETIC SENSOR DEVICE

(71) Applicant: SII Semiconductor Corporation, Chiba-shi, Chiba (JP)

(72) Inventors: Kentaro Fukai, Chiba (JP); Minoru Ariyama, Chiba (JP)

(73) Assignee: Ablic Inc., Chiba-shi, Chiba (JP)

( * ) Notice: Subject to any disclaimer, the term of this patent is extended or adjusted under 35 U.S.C. 154(b) by 281 days.

(21) Appl. No.: 15/451,931

(22) Filed: Mar. 7, 2017

(65) Prior Publication Data

US 2017/0261566 A1    Sep. 14, 2017

(30) Foreign Application Priority Data

Mar. 8, 2016  (JP) ................ 2016-044661
Jan. 18, 2017  (JP) ................ 2017-006526

(51) Int. Cl.
  *G01R 33/00* (2006.01)
  *H03K 5/24* (2006.01)
  *H03K 17/95* (2006.01)

(52) U.S. Cl.
  CPC ..... *G01R 33/0023* (2013.01); *G01R 33/0029* (2013.01); *H03K 5/24* (2013.01); *H03K 17/9517* (2013.01); *H03K 2217/94042* (2013.01)

(58) Field of Classification Search
  CPC ........... G01R 33/0017; G01R 33/0023; G01R 33/0029; H03K 5/22; H03K 5/24; H03K 5/2472; H03K 17/9517; H03K 2217/94042

USPC .................. 324/200–263, 762.01
See application file for complete search history.

(56) References Cited

U.S. PATENT DOCUMENTS

| | | | | |
|---|---|---|---|---|
| 5,550,469 A | * | 8/1996 | Tanabe | G01R 33/06 324/225 |
| 6,137,287 A | * | 10/2000 | Ichihashi | G01D 3/08 324/160 |
| 8,513,970 B2 | * | 8/2013 | Kameda | G01R 31/2884 257/499 |
| 9,176,007 B2 | * | 11/2015 | Okada | H03F 3/08 |
| 9,453,889 B2 | * | 9/2016 | Miura | G01R 33/07 |
| 9,638,761 B2 | * | 5/2017 | Hikichi | G01R 33/0017 |
| 9,785,163 B2 | * | 10/2017 | Takano | G05F 1/573 |
| 9,810,746 B2 | * | 11/2017 | Fukai | G01R 33/07 |
| 10,107,698 B2 | * | 10/2018 | Hirai | G01L 1/2262 |

(Continued)

FOREIGN PATENT DOCUMENTS

JP    2001-165944 A    6/2001

*Primary Examiner* — Patrick Assouad
*Assistant Examiner* — Sean Curtis
(74) *Attorney, Agent, or Firm* — Brinks Gilson & Lione

(57) ABSTRACT

Provided are a magnetic sensor, which is capable of accurately determining abnormalities, such as disconnection and a short circuit, of wiring of a magnetic sensor device, and the magnetic sensor device. An output control circuit of the magnetic sensor includes a voltage divider circuit, which is connected to an output terminal of the magnetic sensor, and an amplifier, which is configured to control a gate voltage of a MOS transistor, which is connected to the output terminal of the magnetic sensor, so that a voltage of the voltage divider circuit and a reference voltage become equal to each other, with the result that an output voltage of the magnetic sensor is determined by the reference voltage and a voltage dividing ratio of the voltage divider circuit.

2 Claims, 4 Drawing Sheets

(56) References Cited

U.S. PATENT DOCUMENTS

| | | | | |
|---|---|---|---|---|
| 2010/0045272 A1* | 2/2010 | Kondo | ............... | G01D 5/145 |
| | | | | 324/207.13 |
| 2014/0009143 A1* | 1/2014 | Blagojevic | ............ | G01R 33/04 |
| | | | | 324/244 |
| 2014/0009146 A1* | 1/2014 | Blagojevic | ............ | G01R 33/04 |
| | | | | 324/252 |
| 2015/0115942 A1* | 4/2015 | Hikichi | ............ | G01R 33/0017 |
| | | | | 324/225 |
| 2015/0377647 A1* | 12/2015 | Fukai | ............... | G01R 33/07 |
| | | | | 324/207.2 |
| 2015/0377983 A1* | 12/2015 | Miura | ............... | G01R 33/0041 |
| | | | | 324/251 |
| 2016/0097692 A1* | 4/2016 | Hirai | ............... | G01L 1/2262 |
| | | | | 73/754 |
| 2016/0341571 A1* | 11/2016 | Sun | ............... | G01D 5/142 |
| 2017/0084825 A1* | 3/2017 | Tsunoda | ............... | H01L 43/08 |
| 2017/0199535 A1* | 7/2017 | Takano | ............... | G05F 1/573 |
| 2017/0261566 A1* | 9/2017 | Fukai | ............... | G01R 33/0023 |

\* cited by examiner

US 10,401,438 B2

MAGNETIC SENSOR AND MAGNETIC SENSOR DEVICE

RELATED APPLICATIONS

This application claims priority under 35 U.S.C. § 119 to Japanese Patent Applications No. 2016-044661 filed on Mar. 8, 2016 and No. 2017-006526 filed on Jan. 18, 2017, the entire content of which is hereby incorporated by reference.

BACKGROUND OF THE INVENTION

1. Field of the Invention

The present invention relates to a magnetic sensor, and more particularly, to a magnetic sensor, which has a configuration of externally pulling up an output terminal, and to a magnetic sensor device.

2. Description of the Related Art

A magnetic sensor device includes a magnetic detection element, which is configured to convert a magnetic flux density into an electric signal, to electrically determine which of the magnetic flux density, which is changed depending on a change in relative distance from a member to be detected including a magnetic body, and a preset magnetic flux density threshold is larger or smaller, and to output a detection signal of a two-level voltage. In a switching system using a magnetic sensor, especially in the automotive field, in order to provide safety to a user of an automatic vehicle, it is required to construct a system from the viewpoint of functional safety (ISO 26262). For example, it is required to eliminate the fear that an erroneous switching operation may be performed due to a failure of a magnetic sensor element itself, or a failure of a signal transmission path in the system.

In FIG. 4, a related-art magnetic sensor device is illustrated. A magnetic sensor 50 includes a signal processing circuit 51 including a magnetic sensor, a transistor 52, a constant current circuit 53, and a resistor 54. A discrimination circuit 59 is connected to GND in common with the magnetic sensor 50, and has a terminal IN connected to a terminal OUT of the magnetic sensor 50. Further, the magnetic sensor 50 has a terminal IN pulled up to a voltage VDD by a pull-up resistor 58.

The magnetic sensor 50 outputs two values: a high level value, which is lower than the voltage VDD by a predetermined value, and a low level value, which is higher than the voltage GND by a predetermined value, to the terminal OUT. The discrimination circuit 59 has an abnormality detection function of determining an abnormality when an input voltage level is a voltage other than voltages in the vicinity of those two values.

With such a configuration in which a predetermined voltage level that is not equivalent to the voltage VDD and the voltage GND is determined as normal, abnormalities, such as disconnection of an input terminal, may be easily detected. For example, when wiring between the terminal OUT of the magnetic sensor 50 and the terminal IN of the discrimination circuit 59 is disconnected and opened, the input level of the discrimination circuit 59 becomes the voltage VDD, and hence an abnormality is determined. Moreover, when the wiring between the terminal OUT of the magnetic sensor 50 and the terminal IN of the discrimination circuit 59 is short-circuited to the voltage GND, the input level of the discrimination circuit 59 becomes the voltage GND, and hence an abnormality is determined.

In the case of the above-mentioned circuit configuration, the input voltage level of the discrimination circuit 59 in normality is determined by the resistor 54, the constant current circuit 53, the transistor 52, and the pull-up resistor 58. The pull-up resistor 58 is varied in resistance value due to a variation in manufacturing, with the result that the input voltage level is varied.

SUMMARY OF THE INVENTION

In order to solve the above-mentioned problem, an output control circuit of a magnetic sensor according to one embodiment of the present invention includes a voltage divider circuit, which is connected to an output terminal of the magnetic sensor, and an amplifier, which is configured to control a gate voltage of a metal-oxide-semiconductor (MOS) transistor, which is connected to the output terminal of the magnetic sensor, so that a voltage of the voltage divider circuit and a reference voltage become equal to each other.

According to the magnetic sensor of the present invention, an output voltage of the magnetic sensor is determined by the reference voltage and a voltage dividing ratio of the voltage divider circuit, and hence the effect of not being affected by a variation in resistance value of the pull-up resistor is provided. Therefore, a discrimination circuit can accurately determine abnormalities, such as disconnection and a short circuit, of wiring of a magnetic sensor device.

DETAILED DESCRIPTION OF THE PREFERRED EMBODIMENTS

Now, embodiments of the present invention are described with reference to the drawings.

Figure 1:
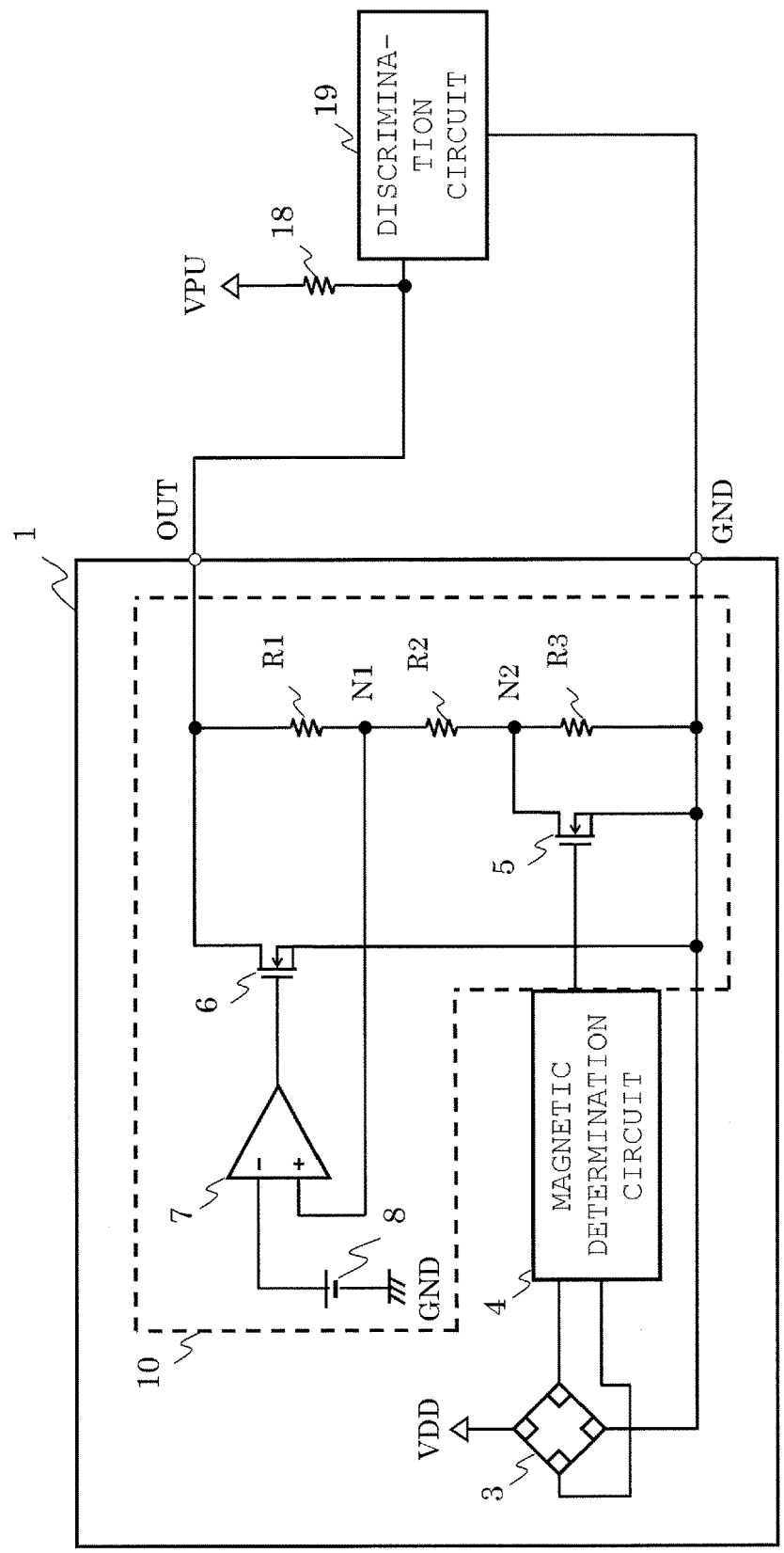
FIG. 1 is a circuit diagram for illustrating a magnetic sensor according to a first embodiment of the present invention.

FIG. 1 is a circuit diagram for illustrating a magnetic sensor according to a first embodiment of the present invention.

A magnetic sensor device includes a magnetic sensor 1, a pull-up resistor 18, and a discrimination circuit 19.

The magnetic sensor 1 according to the first embodiment includes a magnetic sensor element 3, a magnetic determination circuit 4, and an output control circuit 10. The output control circuit 10 includes a MOS switch 5, an output drive element 6, an amplifier 7, a reference voltage circuit 8, and resistors R1, R2, and R3 forming a voltage divider circuit.

In the magnetic sensor 1, an output terminal OUT to be connected to an input terminal of the discrimination circuit 19 is connected to an external power supply terminal VPU via the pull-up resistor 18. The magnetic sensor element 3 has input terminals connected to a power supply terminal VDD and a ground terminal GND, and output terminals connected to input terminals of the magnetic determination circuit 4. The output drive element 6 is formed of an N-channel metal-oxide-semiconductor field-effect transistor (MOSFET), for example, and has a drain connected to the output terminal OUT, and a source connected to the ground terminal GND. The resistor R1 has one end connected to the output terminal OUT, and another end (node N1) connected to one end of the resistor R2. The resistor R2 has another end (node N2) connected to one end of the resistor R3. The resistor R3 has another end connected to the ground terminal GND. The amplifier 7 has an output terminal connected to a gate of the output drive element 6, an inverting input terminal connected to an output terminal of the reference voltage circuit 8, and a non-inverting input terminal connected to the node N1. The MOS switch 5 is formed of an N-channel MOSFET, for example, and has a gate connected to an output terminal of the magnetic determination circuit 4, a drain connected to the node N2, and a source connected to the ground terminal GND.

The discrimination circuit 19 has a function of discriminating a high level value and a low level value, which depend on a magnetic flux density output by the magnetic sensor 1, as well as an abnormality detection function. The abnormality detection function determines that the magnetic sensor device is normal when the input voltage is in the vicinity of the high level value and the low level value, and determines that the magnetic sensor device is abnormal when the input voltage is in a voltage range other than the vicinity of the high level value and the low level value.

The magnetic sensor element 3 is supplied with power from the voltage VDD, and outputs an electric signal corresponding to a magnetic flux density input to the magnetic sensor element. As the magnetic sensor element 3, a Hall element may be used, for example. The magnetic determination circuit 4 compares the electric signal output from the magnetic sensor element 3, and a preset threshold signal to each other, and outputs a magnetic determination result to the output control circuit 10 as a two-value voltage: the voltage VDD and the voltage GND.

When the output of the magnetic determination circuit 4 is the voltage GND, the MOS switch 5 is in an off state, and the node N2 is connected to the ground terminal GND via the resistor R3.

Meanwhile, when the output of the magnetic determination circuit 4 is the voltage VDD, the MOS switch 5 is in an on state, and the node N2 is connected to the ground terminal GND.

Between the output terminal OUT and the ground terminal GND, the output drive element 6 is connected electrically in parallel to the voltage divider circuit. The output drive element 6 is an N-channel MOSFET, and a gate voltage thereof may be controlled to allow a drain current to flow between the output terminal OUT and the ground terminal GND. Moreover, the amplifier 7 has the non-inverting input terminal connected to the node N1, the inverting input terminal connected to the reference voltage circuit 8, and the output terminal connected to the gate terminal of the output drive element 6, and hence controls the output drive element 6 so that a voltage at the node N1 becomes equal to a reference voltage of the reference voltage circuit 8.

When an output voltage at the output terminal OUT of the magnetic sensor 1 is represented by VOUT, and the reference voltage of the reference voltage circuit 8 is represented by VREF, the output voltage VOUT is expressed by the following two expressions depending on the cases of the magnetic determination result:

$$VOUT=(1+R1/R2)\times VREF \quad (1);$$

and $$VOUT=\{1+R1/(R2+R3)\}\times VREF \quad (2).$$

The expression 1 indicates the output voltage VOUT when the output of the magnetic determination circuit 4 is the voltage VDD. The expression 2 indicates the output voltage VOUT when the output of the magnetic determination circuit 4 is the voltage GND.

As described above, the output voltage VOUT of the magnetic sensor 1 does not depend on a resistance value of the pull-up resistor 18, and hence is not affected by a variation of the pull-up resistor 18. Therefore, a pull-up resistor value may be set flexibly, and hence as a further effect, the pull-up resistor value may be increased to save electric power of a magnetic sensor system.

Now, an example of specific resistance values for realizing the magnetic sensor 1 according to the first embodiment is described.

Circuit constants are determined such that the output voltage VOUT expressed by the expression 1 and the output voltage VOUT expressed by the expression 2 become 4.5 V and 0.5 V, respectively, when the external power supply VPU is 5.0 V and the reference voltage VREF is 0.3 V. It can be seen from the expression 1 and the expression 2 that a ratio of R1:R2:R3 may be set to 7:0.5:10.

More specifically, in order not to limit the resistance value of the pull-up resistor 18, it is desired that the resistance values of the resistors R1 to R3 be as large as possible. When the resistance value of the pull-up resistor 18 is represented by RPU, an allowable value thereof is determined from the following expression 3:

$$RPU>(VPU-VOUT(1))/\{VOUT(1)/(R1+R2+R3)\} \quad (3).$$

For example, when R1=700 kΩ, R2=50 kΩ, and R3=1 MΩ, the magnetic sensor 1 is operable when the resistance value RPU of the pull-up resistor 18 is less than 194 kΩ.

More realistically, when an allowable range of the drain current of the output drive element 6 is taken into consideration, it is desired that the resistance value of the pull-up resistor 18 be several tens of Ω or more.

As described above, according to the magnetic sensor 1 of the first embodiment, the input voltage of the discrimination circuit 19 is determined by the reference voltage and a voltage dividing ratio of the voltage divider circuit, and hence abnormalities, such as disconnection and a short circuit, of wiring may be accurately determined without being affected by the variation in resistance value of the pull-up resistor 18.

The resistors of the voltage divider circuit may be configured to be trimmable so that the output voltage VOUT may be adjusted depending on the input voltage determined by the discrimination circuit 19.

Figure 2:
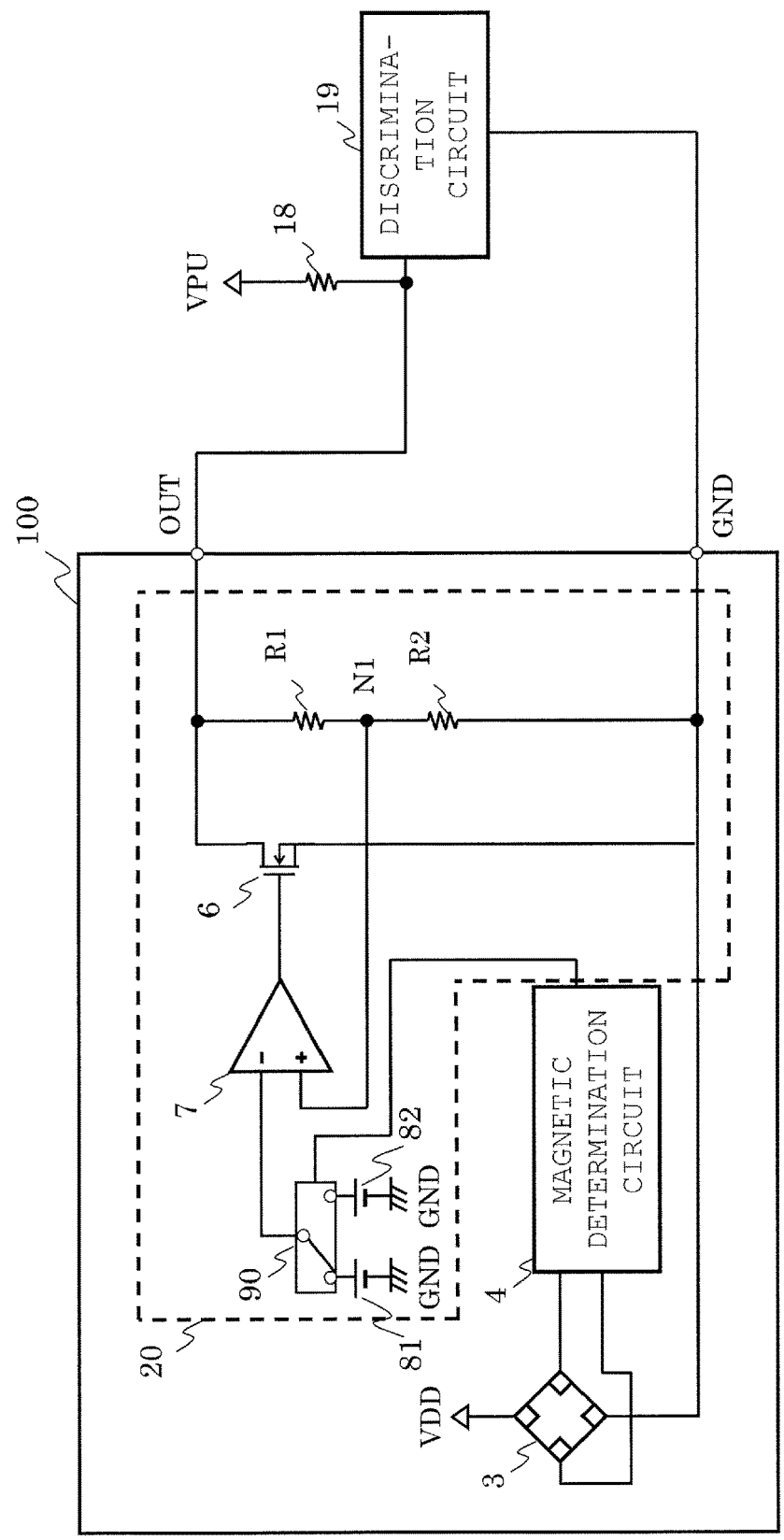
FIG. 2 is a circuit diagram for illustrating a magnetic sensor according to a second embodiment of the present invention.

FIG. 2 is a circuit diagram for illustrating a magnetic sensor according to a second embodiment of the present invention.

A magnetic sensor device 100 includes the magnetic sensor element 3, the magnetic determination circuit 4, and an output control circuit 20. The output control circuit 20 includes the output drive element 6, the amplifier 7, the resistors R1 and R2 forming a voltage divider circuit, a reference voltage circuit 81, a reference voltage circuit 82, and a MOS switch 90.

The magnetic sensor 100, the discrimination circuit 19, and the pull-up resistor 18 are connected and operate similarly to those in the first embodiment. Further, the magnetic sensor element 3, the magnetic determination circuit 4, the output drive element 6, and the amplifier 7 are connected and operate similarly to those in the first embodiment, and hence a description thereof is omitted.

The MOS switch 90 is formed of a complementary metal-oxide-semiconductor (CMOS) transistor, for example, and is configured to alternatively select the reference voltage circuit 81 or the reference voltage circuit 82 to be connected to the inverting input terminal of the amplifier 7. The MOS switch 90 has a control terminal, and the two-value voltage output from the magnetic determination circuit 4 is input to the control terminal.

When the output of the magnetic determination circuit 4 is the voltage GND, the MOS switch 90 selects the reference voltage circuit 81 to connect an output terminal of the reference voltage circuit 81 to the inverting input terminal of the amplifier 7.

Meanwhile, when the output of the magnetic determination circuit 4 is the voltage VDD, the MOS switch 90 selects the reference voltage circuit 82 to connect an output terminal of the reference voltage circuit 82 to the inverting input terminal of the amplifier 7.

A reference voltage generated by the reference voltage circuit 81 is represented by VREF1, and a reference voltage generated by the reference voltage circuit 82 is represented by VREF2. The reference voltage VREF1 and the reference voltage VREF2 are reference voltages having different values.

When an output voltage at an output terminal OUT of the magnetic sensor 100 is represented by VOUT, the output voltage VOUT is expressed by the following two expressions depending on the cases of the magnetic determination result:

$$VOUT=(1+R1/R2)\times VREF1 \qquad (4);$$

and $$VOUT=(1+R1/R2)\times VREF2 \qquad (5).$$

The expression 4 indicates the output voltage VOUT when the output of the magnetic determination circuit 4 is the voltage GND. The expression 5 indicates the output voltage VOUT when the output of the magnetic determination circuit 4 is the voltage VDD.

Now, specific numerical examples for realizing the magnetic sensor 100 according to the second embodiment are described.

Circuit constants are determined such that the output voltage VOUT expressed by the expression 4 and the output voltage VOUT expressed by the expression 5 become 4.5 V and 0.5 V, respectively, when the external power supply VPU is 5.0 V. When the reference voltage circuit 81 is set so that the reference voltage VREF1 is 3.0 V, it can be seen from the expression 4 that a ratio of R1:R2 may be set to 0.5:1. Moreover, it can be seen from the expression 4 and the expression 5 that the reference voltage VREF2 may be set to 0.33 V.

Figure 3:
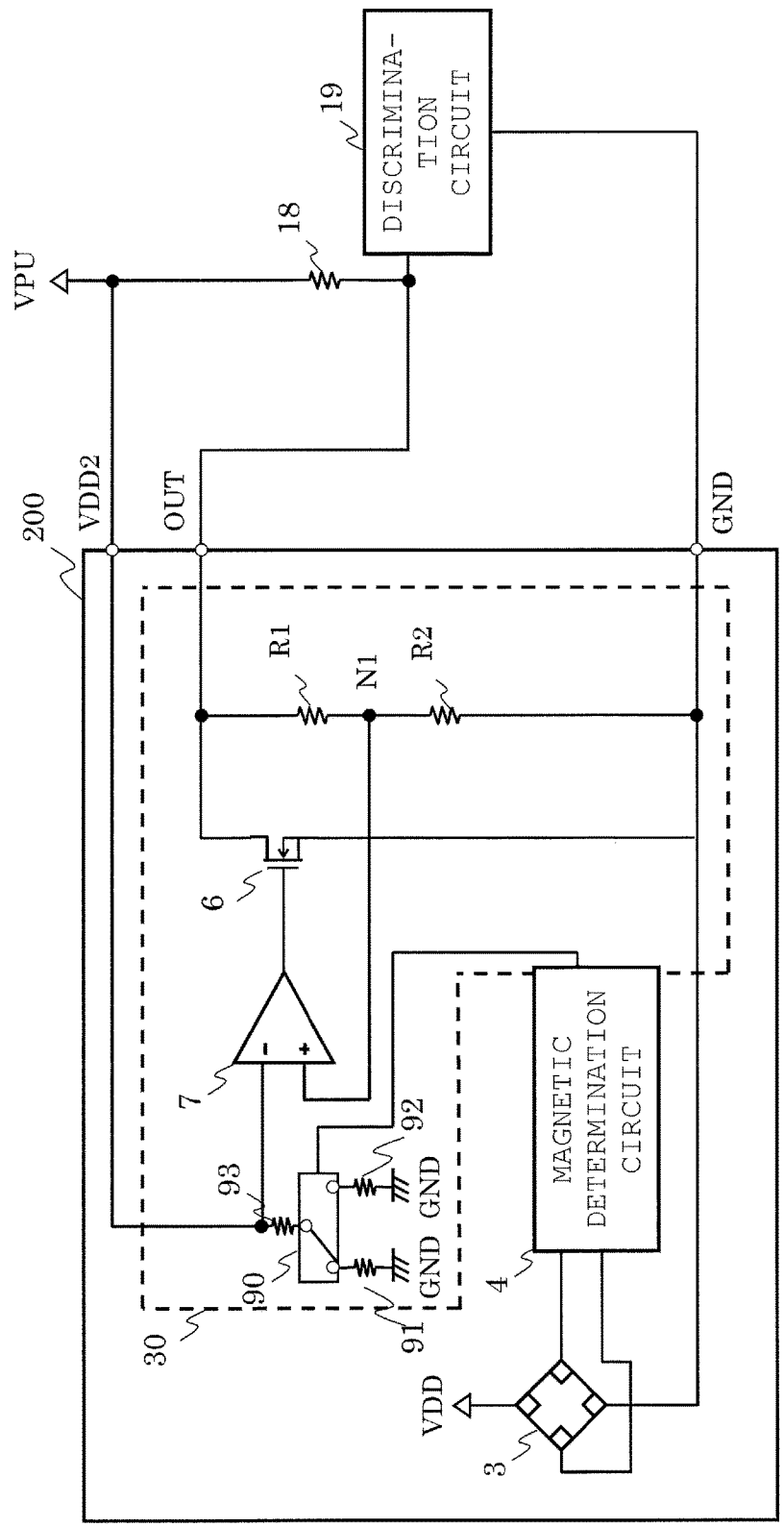
FIG. 3 is a circuit diagram for illustrating a magnetic sensor according to a third embodiment of the present invention.
Figure 4:
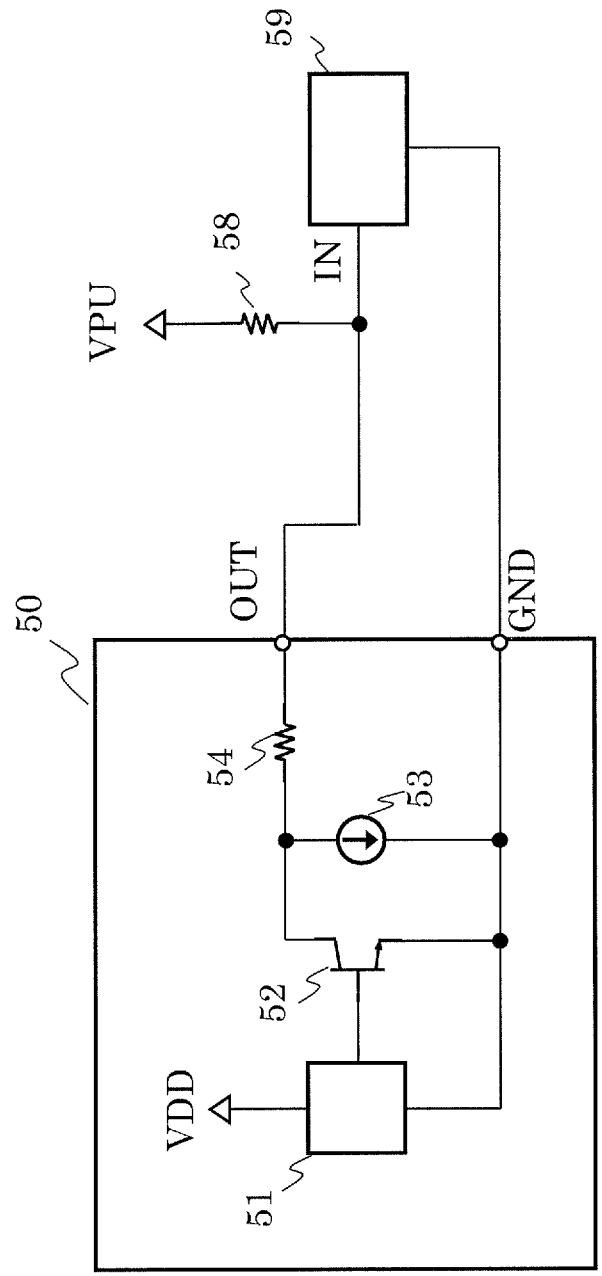
FIG. 4 is a circuit diagram for illustrating a related-art magnetic sensor device.

FIG. 3 is a circuit diagram for illustrating a magnetic sensor according to a third embodiment of the present invention.

A magnetic sensor device 200 includes the magnetic sensor element 3, the magnetic determination circuit 4, and an output control circuit 30.

The third embodiment is different from the second embodiment in that a reference voltage circuit includes a resistor 91, a resistor 92, and a resistor 93. Moreover, a magnetic sensor 200 has a VDD2 terminal connected to the external power supply VPU, and the VDD2 terminal is connected to one end of the resistor 93 and the inverting input terminal of the amplifier 7. The resistor 93 is connected to any one of the resistor 91 and the resistor 92 by the MOS switch 90. Further, the resistors subject the voltage VPU to resistive voltage division to obtain a reference voltage.

When the output of the magnetic determination circuit 4 is the voltage VDD, the MOS switch 90 selects the resistor 91 to be serially connected to the resistor 93. When the output of the magnetic determination circuit 4 is the voltage GND, the MOS switch 90 selects the resistor 92 to be serially connected to the resistor 93.

A reference voltage generated by the external power supply VPU, the resistor 93, and the resistor 91 is represented by VREF1, and a reference voltage generated by the external power supply VPU, the resistor 93, and the resistor 92 is represented by VREF2. The reference voltage VREF1 and the reference voltage VREF2 are reference voltages having different values.

When an output voltage at an output terminal OUT of the magnetic sensor 200 is represented by VOUT, the output voltage VOUT is expressed by the expression 4 and the expression 5 as in the magnetic sensor 100 according to the second embodiment.

Now, specific numerical examples for realizing the magnetic sensor 200 according to the third embodiment are described.

Circuit constants are determined such that the output voltage VOUT expressed by the expression 4 and the output voltage VOUT expressed by the expression 5 become 4.5 V and 0.5 V, respectively, when the external power supply VPU is 5.0 V. A ratio of the output voltage VOUT expressed by the expression 4 and the output voltage VOUT expressed by the expression 5 is 9:1, and hence a ratio of the reference voltage VREF1 and the reference voltage VREF2 is also set to 9:1. When the reference voltage VREF1 is 3.0 V, and the reference voltage VREF2 is 0.33 V, it can be seen from the expression 4 that a ratio of R1:R2 may be set to 0.5:1. Further, the resistor 91, the resistor 92, and the resistor 93 may realize the third embodiment when the resistor 91, the resistor 92, and the resistor 93 are set to 300 kΩ, 14 kΩ, and 200 kΩ, respectively.

As described above, according to the magnetic sensor of the present invention, the input voltage of the discrimination circuit 19 is determined by the reference voltage and a voltage dividing ratio of the voltage divider circuit, and hence abnormalities, such as disconnection and a short circuit, of wiring may be accurately determined without being affected by the variation in resistance value of the pull-up resistor 18.

What is claimed is:

1. A magnetic sensor, in which an output terminal to be connected to an input terminal of a discrimination circuit is connected to an external power supply terminal via a pull-up resistor, the magnetic sensor comprising:
   a magnetic sensor element;
   a determination circuit, to which an output voltage of the magnetic sensor element is input; and
   an output control circuit, which is configured to output a signal from the determination circuit to the output terminal of the magnetic sensor,
   the output control circuit comprising:
      a first resistor, a second resistor, and a third resistor, which are connected in series between the output terminal of the magnetic sensor and a ground terminal;
      a first MOS transistor, which has a gate connected to an output terminal of the determination circuit, a drain connected to a node between the second resistor and the third resistor, and a source connected to the ground terminal;

an amplifier, which has an inverting input terminal connected to an output terminal of a reference voltage circuit, and a non-inverting input terminal connected to a node between the first resistor and the second resistor; and a second MOS transistor, which has a gate connected to an output terminal of the amplifier, a drain connected to the output terminal of the magnetic sensor, and a source connected to the ground terminal.

2. A magnetic sensor device, comprising:

the magnetic sensor of claim 1;

a discrimination circuit, which has an input terminal connected to the output terminal of the magnetic sensor; and a pull-up resistor, which is connected between the output terminal of the magnetic sensor and an external power supply terminal.

* * * * *